(12) United States Patent
Yeh et al.

(10) Patent No.: US 9,270,035 B2
(45) Date of Patent: Feb. 23, 2016

(54) CARRIER AND CARRIER ASSEMBLY USED THEREOF FOR POSITIONING IC PACKAGE

(71) Applicant: HON HAI PRECISION INDUSTRY CO., LTD., New Taipei (TW)

(72) Inventors: Cheng-Chi Yeh, New Taipei (TW); Chih-Kai Yang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 101 days.

(21) Appl. No.: 14/161,629

(22) Filed: Jan. 22, 2014

(65) Prior Publication Data

US 2014/0328037 A1    Nov. 6, 2014

(30) Foreign Application Priority Data

May 2, 2013   (TW) .............................. 102115639 A

(51) Int. Cl.
*H01R 12/00* (2006.01)
*H01R 4/48* (2006.01)
*H05K 7/10* (2006.01)

(52) U.S. Cl.
CPC ... *H01R 4/48* (2013.01); *H05K 7/10* (2013.01)

(58) Field of Classification Search
CPC .... H01R 13/193; H01R 12/88; H01R 12/716; H01R 13/24; H01R 13/62933; H01R 13/631; H01R 13/2421; H01R 13/639
See application file for complete search history.

(56) References Cited

U.S. PATENT DOCUMENTS

| | | | | |
|---|---|---|---|---|
| 6,917,902 B2 * | 7/2005 | Alexander | ..................... | 702/189 |
| 6,932,622 B2 * | 8/2005 | Liao et al. | ....................... | 439/73 |
| 6,969,267 B2 * | 11/2005 | Byquist | ............................ | 439/73 |
| 7,083,456 B2 * | 8/2006 | Trout et al. | .................... | 439/326 |
| 7,507,101 B2 * | 3/2009 | Chiang | ........................... | 439/331 |
| 8,747,120 B2 * | 6/2014 | Terhune, IV | .................... | 439/41 |

FOREIGN PATENT DOCUMENTS

| | | |
|---|---|---|
| CN | 201174441 | 12/2008 |
| CN | 101685932 A | 3/2010 |
| CN | 101848251 A | 9/2010 |
| CN | 202178462 U | 3/2012 |
| CN | 202363612 | 8/2012 |
| CN | 202633655 | 12/2012 |
| CN | 202633656 | 12/2012 |
| CN | 202633657 | 12/2012 |
| CN | 202633658 | 12/2012 |
| JP | 4142222 | 6/2008 |
| TW | M294748 | 7/2006 |
| TW | 442615 | 12/2012 |
| TW | 201312322 | 3/2013 |
| WO | WO20122082130 | 6/2012 |

* cited by examiner

*Primary Examiner* — Xuong Chung Trans
(74) *Attorney, Agent, or Firm* — Wei Te Chung; Ming Chieh Chang

(57) ABSTRACT

A carrier assembly (100) comprises an IC package (200) and a carrier (300) for positioning the IC package (200), the IC package (200) includes a body portion (22), a die portion (21) extending upwardly from the body portion (22) and a ear portion (232) extending from the die portion (21), the ear portion (232) and the body portion (22) defines a space (231), the carrier (300) includes a first side (310), a second side (312) opposite to the first side (310), a position portion (343) extending from the first side (310) and a fixing portion (331) extending from the second side (312) positioned in the space (231) of the IC package (200) to position the IC package (200) on the carrier (300).

20 Claims, 11 Drawing Sheets

CARRIER AND CARRIER ASSEMBLY USED THEREOF FOR POSITIONING IC PACKAGE

BACKGROUND OF THE INVENTION

1. Field of the Invention

The present invention relates to a carrier and carrier assembly used thereof for positioning an IC package, and more particularly to a carrier which can easily assemble and detach the IC package. The instant applicant relates to the copending application Ser. No. 13/846,910 filed on Mar. 18, 2013, and another application titled "HOLDING DEVICE USED FOR ELECTRICAL CONNECTOR" and having the same inventors and the same assignee with the instant invention.

2. Description of Related Art

Chinese patent No. 202178462U issued to Cai on Mar. 28, 2012 discloses a conventional electrical connector for electrically connecting an IC package with a substrate. The electrical connector includes an insulative housing, a plurality of contacts received in the insulative housing, a frame located around the insulative housing, a load plate and a lever assembled to the frame, and a carrier assembled to the load plate. When want to assemble the IC package to the electrical connector, first paste the IC package to the carrier and then position the carrier on the load plate, thus the IC package is assembled to the electrical connector by rotating the load plate to the closed position. Due to the IC package is pasted on the carrier securely, when want to detach the IC package from the carrier, it is hard to operate. At the same time there is also glue remained on the IC package or the carrier, which will affect the reusing of the IC package or the carrier.

Hence, it is desirable to provide an improved carrier to overcome the aforementioned disadvantages.

SUMMARY OF THE INVENTION

Accordingly, an object of the present invention is to provide a carrier which can assemble or detach the IC package easily.

According to one aspect of the present invention, a carrier assembly comprises an IC package and a carrier for positioning the IC package, the IC package includes a body portion, a die portion extending upwardly from the body portion and a ear portion extending from the die portion, the ear portion and the body portion defines a space, the carrier includes a first side, a second side opposite to the first side, a position portion extending from the first side and a fixing portion extending from the second side positioned in the space of the IC package to position the IC package on the carrier.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
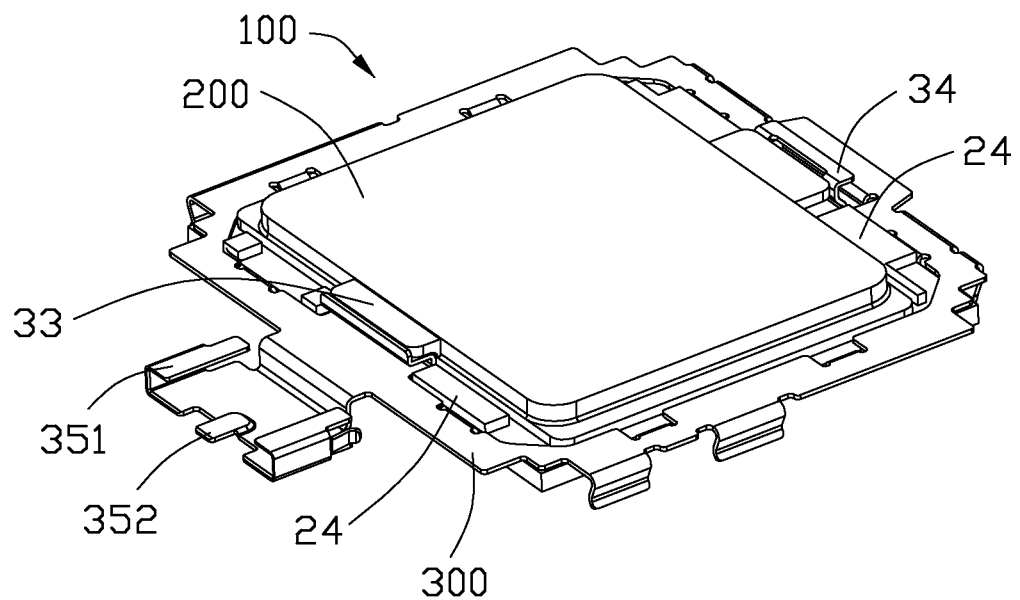
FIG. 1 is an assembled view of a carrier assembly according to a preferred embodiment of the present invention.
Figure 3:
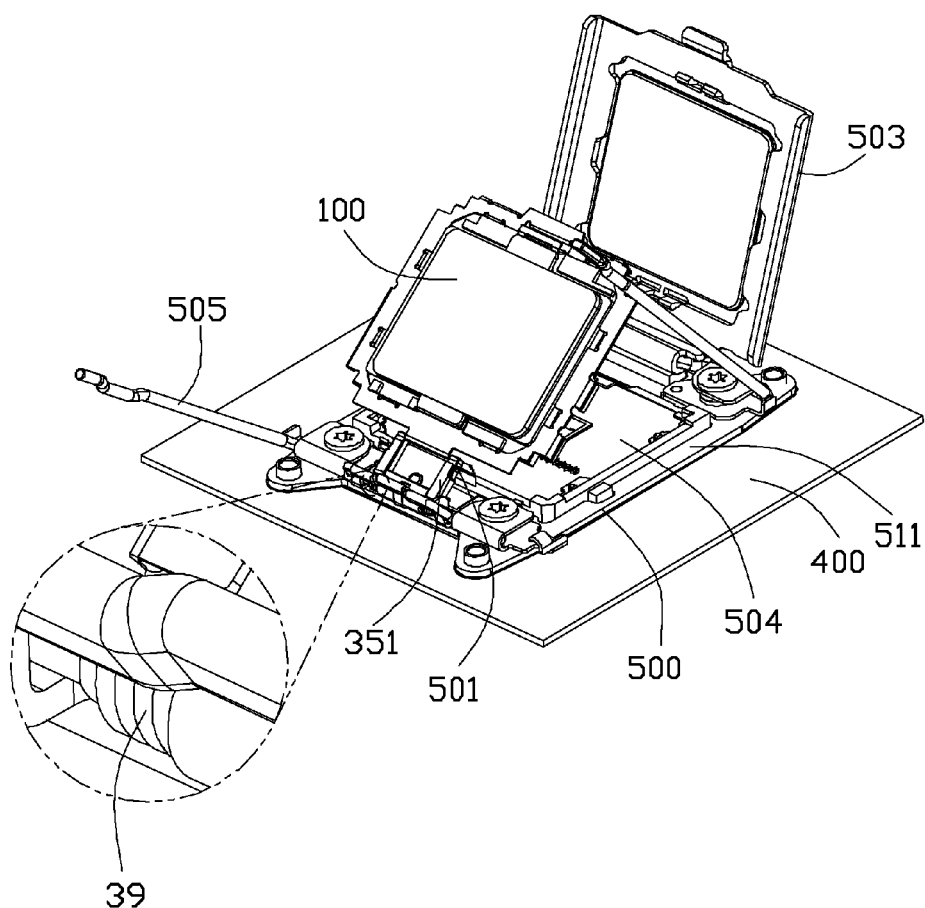
FIG. 3 is an assembled view of the carrier assembly and an socket.

FIG. 1 and FIG. 3 illustrate a carrier assembly 100 in accordance to a preferred embodiment of the present invention. The carrier assembly 100 includes a carrier 300 and an IC package 200 assembled to the carrier 300. The carrier 300 is used for position the IC package 200 and assembled the IC package 200 to a socket 500, which is essentially composed of the insulative housing 504 and the metallic fastener 511 surrounding the housing 504, positioned on a substrate 400, thus to establish an electrical connection between the IC package 200 and the substrate 400.

Figure 2:
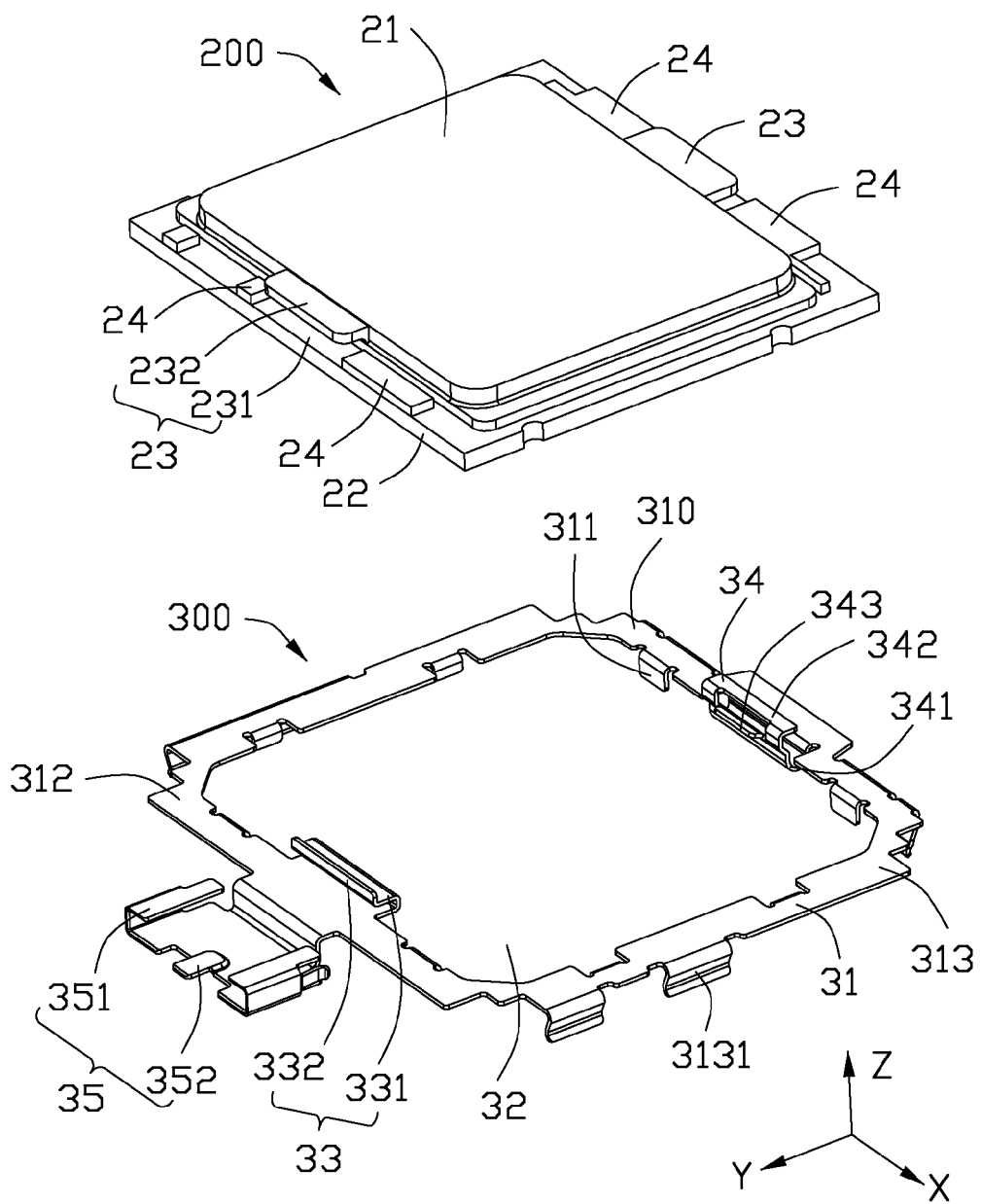
FIG. 2 is an exploded view of the carrier assembly as shown in FIG. 1.

Referring to FIG. 2, the carrier 300 includes a first side 310, a second side 312 opposite to the first side 310 and a pair of third sides 313 connecting the first side 310 and the second side 312. The first side 310 and the second side 312 are extending in a direction defined as X. The pair of third sides 313 is extending in a direction defined as Y. The X direction and the Y direction define a plane. The direction that perpendicular to the X and Y directions is defined as Z direction. The first side 310, the second side 312 and the pair of third sides 313 forms a window 32 to receive the IC package 200. The first side 310, the second side 312 and the pair of third sides 313 all define a position tab 311 extending downwardly and position on the sides of the IC package 200 to position the IC package 200.

The first side 310 includes a first interlocking portion 34 extends toward the window 32 to interlock with the IC package 200. The first interlocking portion 34 includes a spring portion 341 extending from the first side 310, an operation portion 342 and a position portion 343 extending from the spring portion 341. The spring portion 341 extends first downwardly from the first side 310 and then extends upwardly and away from the first side 310 to form a U shape. The operation portion 342 first extends upwardly and then extends toward the first side 310. The first position 341 extends away from the first side 310 to interlock with the IC package 200.

Figure 9:
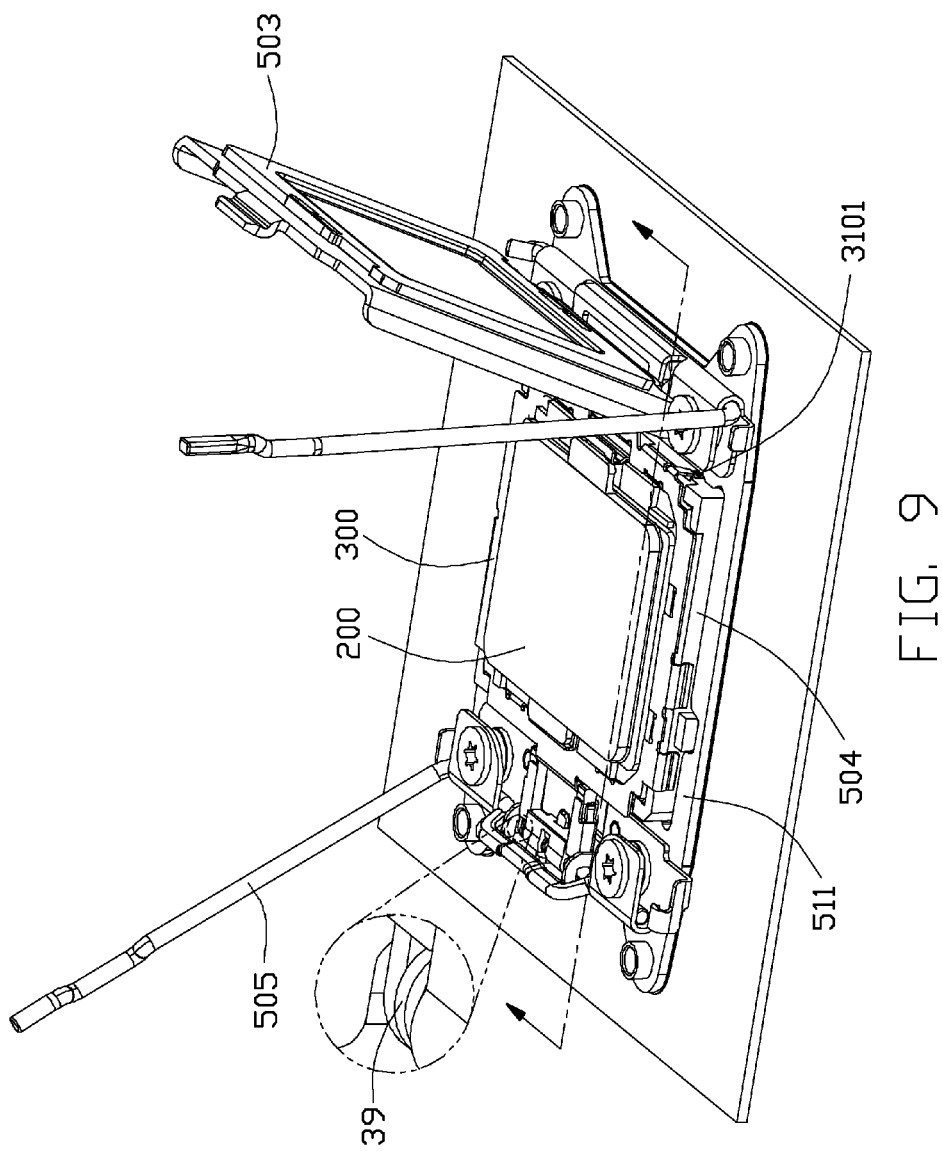
FIG. 9 is similar to FIG. 3, wherein the carrier assembled is assembled to a closed position.

The second side 312 includes a second interlocking portion 33 extends toward the window 32 to interlock with the IC package 200. The second interlocking portion 33 includes a fixing portion 331 extends from the second side 312 and a sustaining portion 332 extends upwardly from fixing portion 331. The second side also includes an assembling portion 35 extending away from the window 32 to be assembled to the socket 500. The assembling portion 35 forms a receiving portion 351 and a post 352. Each of the third sides 313 includes a pair of locating portions 3131 extend downwardly. Referring to FIG. 9, when the carrier assembly 100 is in the closed position, the locating portions 3131 locates on the outside of the insulative housing 504 to make the IC package 200 be assembled to the insulative housing 504 accurately.

Figure 4:
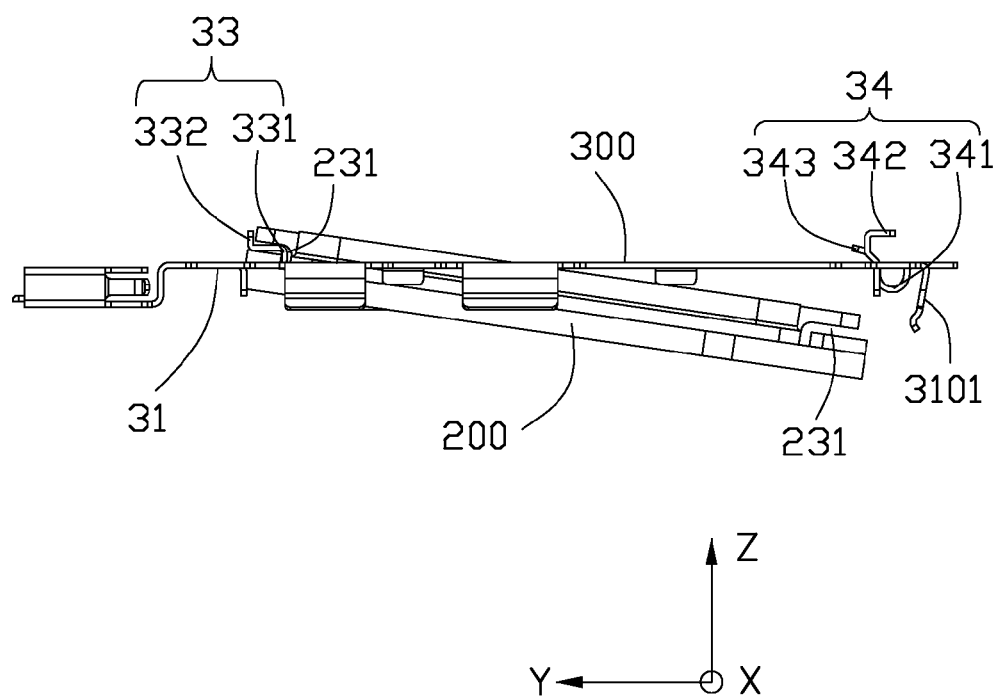
FIG. 4 is a side view of the carrier assembly, showing the IC package being assembled to the carrier.

Referring to FIG. 4, the first side 310 further includes a hook portion 3101 extending downwardly.

The IC package 200 includes a body portion 22, a die portion 21 extending upwardly from the body portion 22 and an ear portion 232 extending outwardly from the die portion 21. There is a space 231 between the body portion 22 and the ear portion 232. The IC package 200 further includes a pair of blocks 24 extending upwardly from the body portion 22 and locates on two sides of the ear portion 232.

Figure 5:
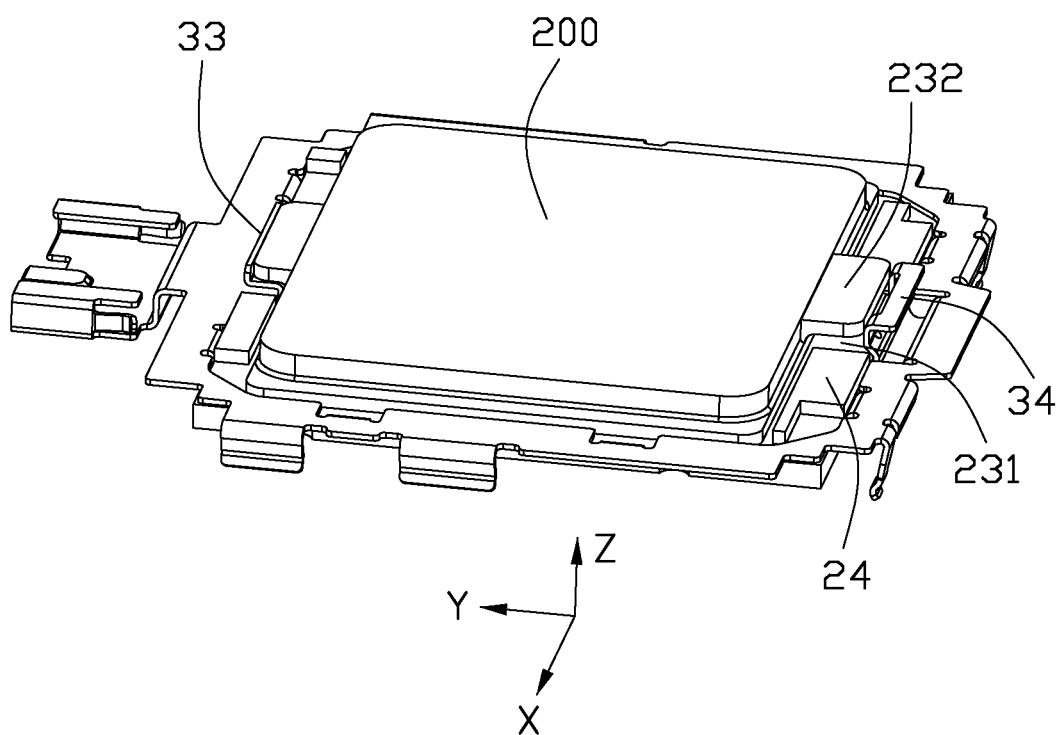
FIG. 5 is another view of the carrier assembly as shown in FIG. 1.
Figure 6:
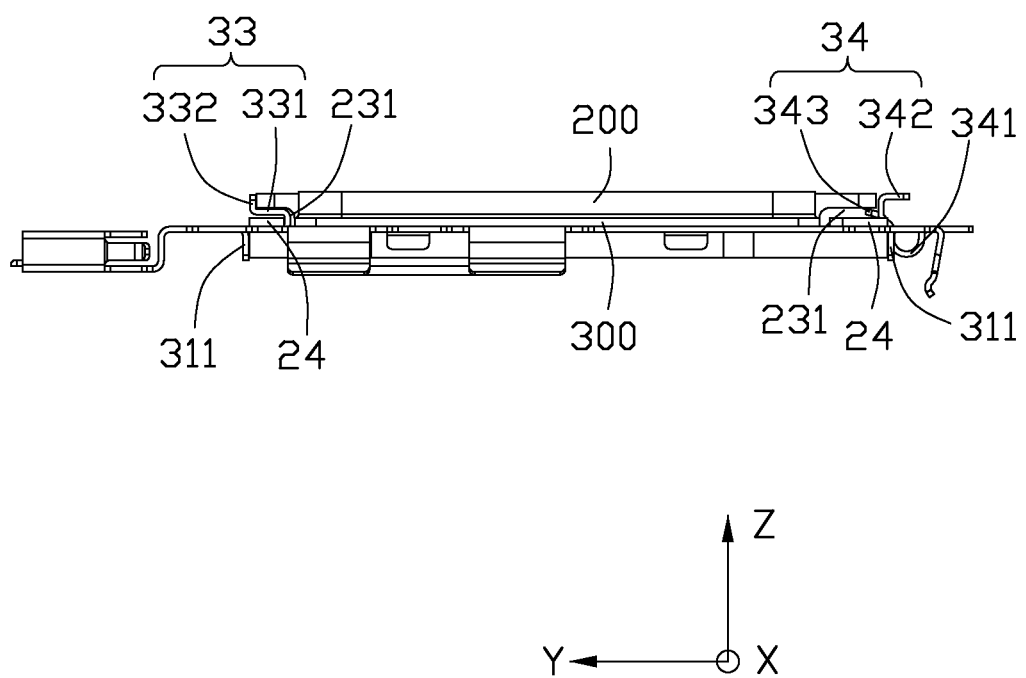
FIG. 6 is a side view of the carrier assembly as shown in FIG. 1.

FIGS. 4-6 disclose the assembling process of the IC package 200 and the carrier 300. The IC package 200 is assembled from the bottom side of the carrier 300. Firstly, put the fixing portion 331 into the space 231 of the IC package 200. Secondly, push the IC package 200 upwardly, the ear portion 232 will tough the position portion 343 and push the position portion 343 move upwardly in Z direction, the spring portion 341 will distort to make the ear portion 232 move outwardly to go into the space 231 of the IC package 200. Thus, the IC package 200 is positioned on the carrier 300 securely. The edge of the ear portion 232 retracts vertically relative to the body portion 22, when the position portion 343 goes to the space 231, it will be blocked by the body portion 22, which can ensure the assembling of the IC package 200 to the carrier 300.

When the IC package 200 is assembled to the carrier 300, the position tab 311 locates on the sides of the body portion 22 of the IC package 200, the operation portion 342 of the first interlocking portion 34 and the sustaining portion 332 of the second interlocking portion 34 locate on the sides of the ear portion 232 to prevent the shaking of the IC package 200. The blocks 24 on the two sides of the ear portion 23 of the IC package 200 also can prevent the shaking of the IC package 200.

Figure 10:
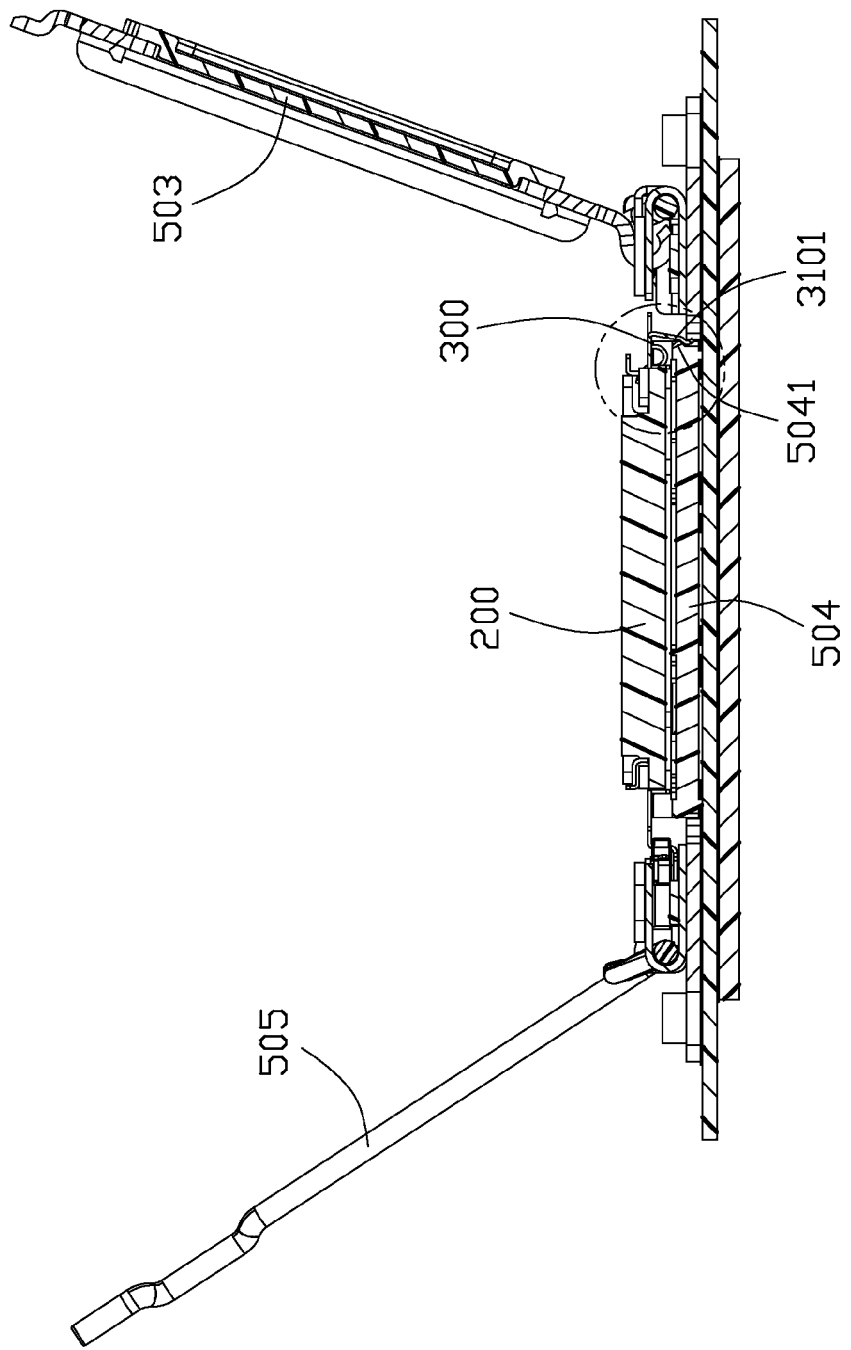
FIG. 10 is a cross-sectional view of the electrical connector along line 10-10 as shown in FIG. 9.
Figure 11:
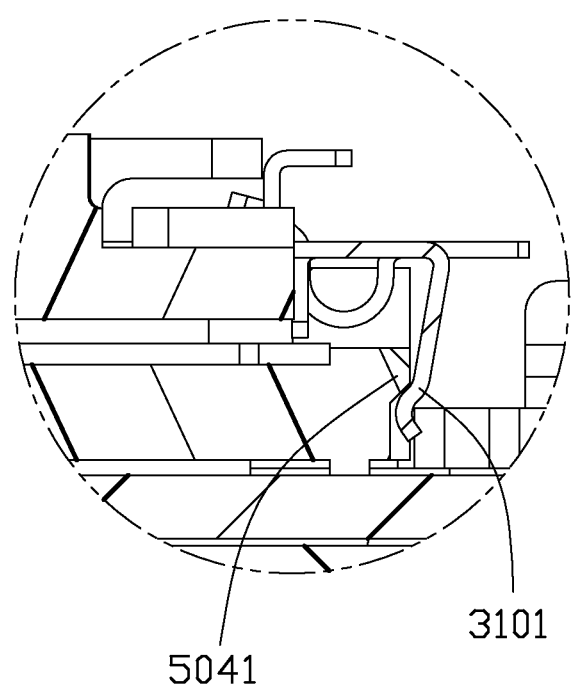
FIG. 11 is an enlarged view of the circular portion as shown in FIG. 10.

Referring to FIG. 3, after the IC package 200 is assembled to the carrier 300, the carrier assembly 100 will be assembled to the socket 500. The socket 500 includes a post 501 to be assembled to the receiving portion 351 of the carrier 300 and a receiving space (not labeled) to receive the post 352 of the carrier 300. Thus, the carrier assembly 100 is assembled to the socket 500 securely. The socket 500 further includes an insulative housing 504, a load cover 503 and a load lever 505 assembled to the fastener around two opposite sides of the insulative housing 504. Referring to FIGS. 9-10, the insulative housing 504 further includes a block 5041 for interlocking with the hook portion 3101 of the carrier 300. When used, open the load lever 505 and the load cover 503 and assemble the carrier assembly 100 to the socket 500. Rotate the carrier assembly 100 to closed position to assemble the IC package 200 to the insulative housing 504. Then rotate the load cover 503 and the load lever 505 to a closed position to press on the IC package 200. Thus a robust electrical connection is established between the IC package 200 and the substrate 400.

When want to detach the IC package 200 from the socket 500, open the load plate 503 and the load lever 505, detach the carrier assembly 100 from the socket 500. Then exert a force on the operation portion 342 of the first interlocking portion 34 to make the first interlocking portion 34 moves outwardly, the position portion 343 then moves upwardly in Z direction and be separated from the ear portion 23 of the IC package 200.

Figure 7:
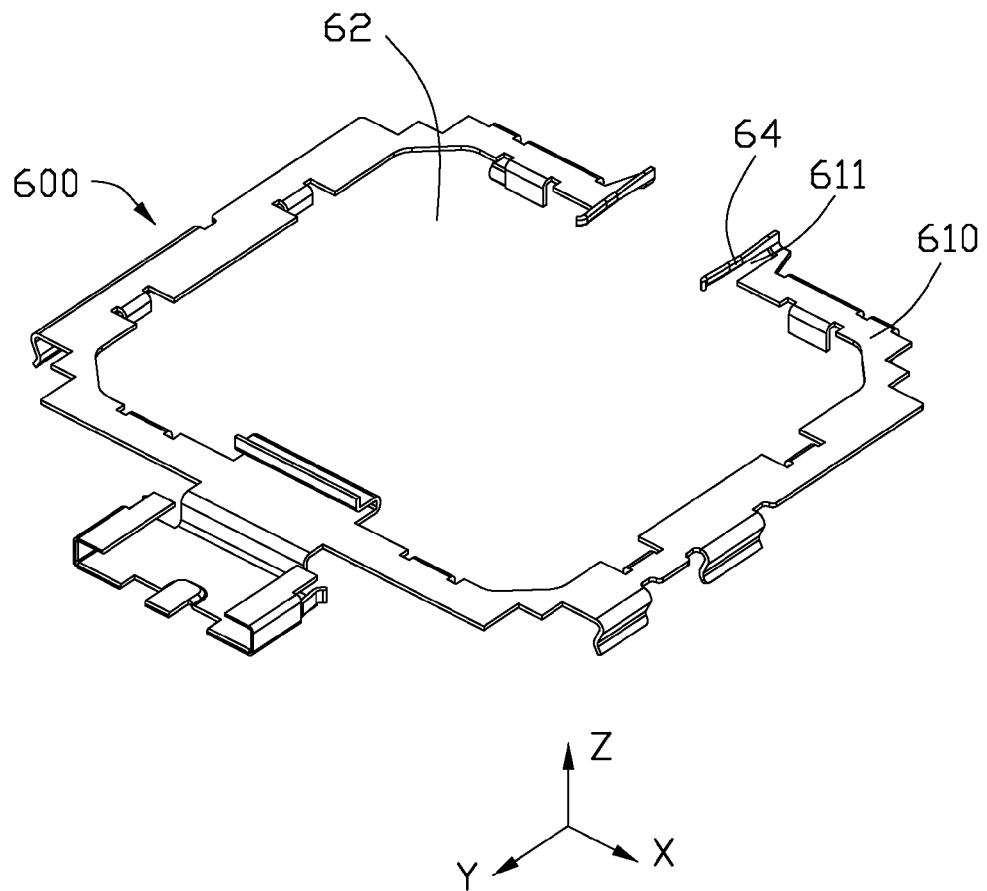
FIG. 7 is an isometric view of the carrier according to a second embodiment of the present invention.

FIG. 7 discloses a second embodiment of the carrier 600. The difference between the first embodiment and the second embodiment is as following: the position portion 64 extends from the first side 610 to the window 62. The position portion 64 extends along a direction perpendicular to the X direction and goes across the upper of the first side 610, further there forms a slot 644 between the position portion and the first side 610, thus to make the position portion 610 move along the X direction to go into the space 231 of the IC package 200 to position the IC package 200 on the carrier 300.

Figure 8:
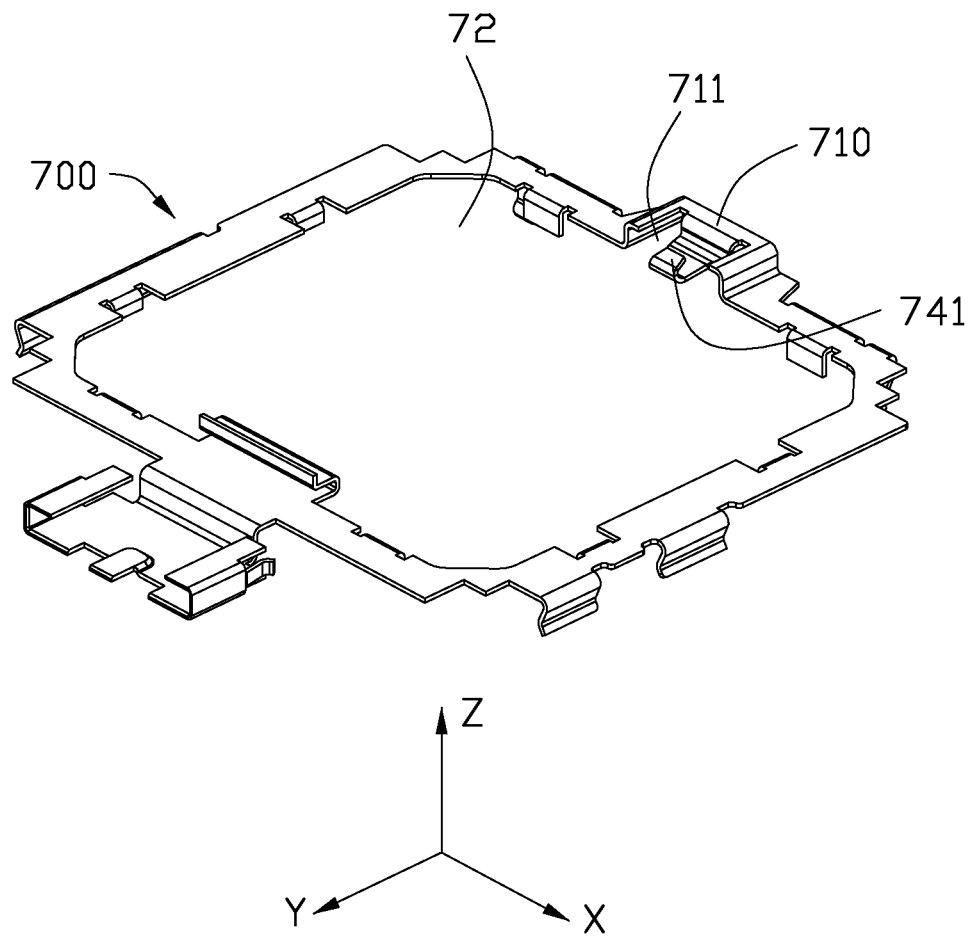
FIG. 8 is an isometric view of the carrier according to a third embodiment of the present invention.

FIG. 8 discloses a third embodiment of the carrier 700. The difference between the first embodiment and the second embodiment is as following: the position portion 74 extends from the first side 710 to the window 72. There is a slot 711 between the position portion 74 and the first side 710, thus the position portion 74 can move along the Z direction to go into the space 231 of the IC package 200 to position the IC package 200 on the carrier 300. As shown in FIGS. 3 and 9, the carrier 300, 700 is equipped with a torsion spring 39 around the end of the housing 504 to constantly urge the carrier 330, 700 upwardly, and with a hook portion 3101 spaced from the torsion spring 39 in said front-to-back direction to resist the torsion spring 39 and lock the carrier with regard to the housing 504 in a horizontal position so as to allow the load cover 503 to be easily further downwardly and pivotally mounted upon the carrier 300, 700 without interference between the load cover 503 and the carrier 300, 700.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. A carrier assembly, comprising:
   an IC package including a body portion, a die portion extending upwardly from the body portion and an ear portion extending from the die portion, the ear portion and the body portion defining a space; and
   a carrier to position the IC package, the carrier including a first side, a second side opposite to the first side, a position portion extending from the first side and a fixing portion extending from the second side positioned in the space of the IC package to position the IC package on the carrier; wherein
   the fixing portion is engaged with the ear portion to secure the IC package on the carrier.

2. The carrier assembly as claimed in claim 1, wherein the carrier further includes a spring portion extends from the first side downwardly and then upwardly to form a U shape, the position portion extends from the spring portion toward the second side.

3. The carrier assembly as claimed in claim 2, wherein carrier further includes an operation portion extending from the spring portion away from said second side.

4. The carrier assembly as claimed in claim 1, wherein the first side extends along a direction that is defined as X direction, the position portion extends along a direction perpendicular to the X direction and goes across the upper of the first side, further there forms a slot between the position portion and the first side.

5. The carrier assembly as claimed in claim 1, wherein the first side extends along a direction that is defined as X direction, the position portion extends along a direction perpendicular to the X direction, further there forms a slot between the position portion and the first side.

6. The carrier assembly as claimed in claim 1, wherein the carrier further includes a sustaining portion extends upwardly from fixing portion to locate on the side of the ear portion.

7. An electrical connector assembly comprising:
   an insulative housing defines an upward receiving cavity therein and a front-to-back direction thereof;
   a plurality of contacts disposed in the housing with contacting sections exposed in the receiving cavity;

a load cover pivotally mounted at one end of the housing in said front-to-back direction;
a carrier pivotally mounted at the other end of the housing in said front-to-back direction; and
an electronic package assembled to the carrier so as to move along with the carrier for being loaded into the receiving cavity and retained in position by the load cover; wherein
said carrier is equipped with a torsion spring at the said other end of the housing to constantly urge the carrier upwardly, and with a hook portion spaced from the torsion spring in said front-to-back direction to resist said torsion spring and lock the carrier with regard to the housing in a horizontal position so as to allow the load cover to be easily further downwardly and pivotally mounted upon the carrier without interference between the load cover and the carrier.

8. The electrical connector assembly as claimed in claim 7, wherein the carrier defines a first side extending in a direction defined as X, a second side opposite to the first side and extending in a direction defined as X, and a pair of third sides connecting the first side and the second side and extending in a direction defined as Y direction that perpendicular to the X direction; wherein the carrier further includes a position portion extending from the first side and a fixing portion extending from the second side for interlocking with the IC package, in a direction defines as Z direction that perpendicular both the X direction and the Y direction.

9. The carrier as claimed in claim 8, wherein the carrier further includes a spring portion extends from the first side downwardly and then upwardly to form a U shape, the position portion extends from the spring portion.

10. The carrier as claimed in claim 9, wherein the carrier further includes an operation portion extending from the spring portion, when exert an outwardly force on the operation portion.

11. The carrier as claimed in claim 8, wherein the position portion extends along the Y direction and goes across the upper of the first side, further there forms a slot between the position portion and the first side.

12. The carrier as claimed in claim 8, wherein the position portion extends along the Y direction, further there forms a slot between the position portion and the first side.

13. An electrical connector assembly comprising:
an insulative housing defines an upward receiving cavity therein and a front-to-back direction thereof;
a plurality of contacts disposed in the housing with contacting sections exposed in the receiving cavity;
a load cover pivotally mounted at one end of the housing in said front-to-back direction;
a carrier pivotally mounted at the other end of the housing in said front-to-back direction; and
an electronic package assembled to the carrier so as to move along with the carrier for being loaded into the receiving cavity and retained in position; wherein
the carrier includes an interlocking portion located at one end of the carrier in said front-to-back direction and functioning as a locking section and a fulcrum section so as to allow the electronic package to be assembled to the carrier in a pivotal manner rather than a linear manner.

14. The electrical connector assembly as claimed 13, wherein said carrier further includes another interlocking portion located at the other end of the carrier in the front-to-back direction and functioning as another locking section and an operation section.

15. The electrical connector assembly as claimed in claim 14, wherein the electronic package includes opposite ear portions engaged with the corresponding first and second interlocking portions, respectively.

16. The electrical connector assembly as claimed in claim 13, wherein said carrier is removeably assembled to a rotatable post which is mounted to the fastener.

17. The electrical connector assembly as claimed in claim 13, wherein the carrier includes a hook portion at the other end of said carrier along said front-to-back direction so as to retain the carrier in a horizontal position.

18. The electrical connector assembly as claimed in claim 17, wherein said hook portion is engaged with the housing to retain the carrier in the horizontal position.

19. The electrical connector assembly as claimed in claim 13, wherein the carrier allows the electronic package to be pivotally assembled thereto from a bottom side thereof.

20. The electrical connector assembly as claimed in claim 13, further including a metallic fastener at least partially surrounding the housing, wherein the carrier and the load cover are mounted to the fastener.

\* \* \* \* \*